Figure 1:
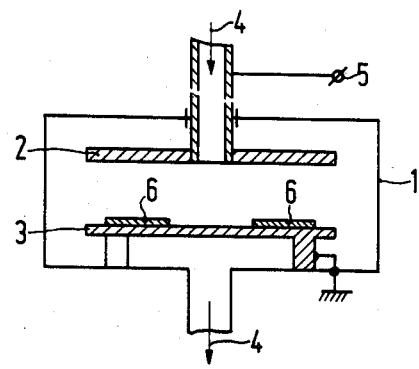
Figure 2:
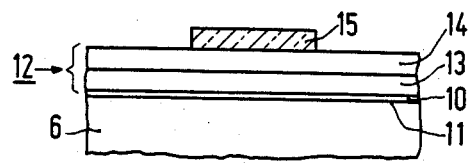

United States Patent [19]

Van Roosmalen et al.

[11] Patent Number: 4,698,126
[45] Date of Patent: Oct. 6, 1987

[54] METHOD OF MANUFACTURING A SEMICONDUCTOR DEVICE BY PLASMA ETCHING OF A DOUBLE LAYER

[75] Inventors: Alfred J. Van Roosmalen; Anton P. M. Van Arendonk, both of Eindhoven, Netherlands

[73] Assignee: U.S. Philips Corporation, New York, N.Y.

[21] Appl. No.: 835,488

[22] Filed: Mar. 3, 1986

[30] Foreign Application Priority Data

Mar. 18, 1985 [NL] Netherlands ............... 8500771

[51] Int. Cl.$^4$ ........................... H01L 21/306
[52] U.S. Cl. ........................ 156/643; 156/657; 156/659.1; 156/653
[58] Field of Search ............ 156/643, 653, 657, 659.1; 252/79.1; 204/192 E

[56] References Cited

U.S. PATENT DOCUMENTS

| | | | |
|---|---|---|---|
| 4,449,287 | 5/1984 | Maas | 156/653 X |
| 4,479,850 | 10/1984 | Beinvogel | 156/657 |
| 4,492,610 | 1/1985 | Okano | 204/192 E |
| 4,640,737 | 2/1987 | Nagasaka | 156/643 |

FOREIGN PATENT DOCUMENTS

| | | | |
|---|---|---|---|
| 0137635 | 10/1981 | Japan | 156/646 |
| 0031140 | 2/1982 | Japan | 156/643 |
| 7406222 | 11/1974 | Netherlands | 156/643 |

OTHER PUBLICATIONS

Donald L. Smith et al. "Plasma Beam Studies of Si and Al Etching Mechanisms" Journal of Vacuum Science Technology, p. 768, 10/82.

Primary Examiner—Kenneth M. Schor
Attorney, Agent, or Firm—Paul R. Miller

[57] ABSTRACT

A method of manufacturing a semiconductor device, in which a double layer consisting of a layer of polycrystalline silicon and a top layer of a silicide is applied to a surface of a semiconductor substrate coated with a layer of silicon oxide. After an etching mask has been provided, the double layer is etched in a plasma formed in chlorine gas to which up to 20% by volume of tetrachloromethane is added until the layer of polycrystalline silicon is etched. Thus, the double layer is etched anisotropically and the layer of silicon oxide is attacked in practice to a very small extent.

5 Claims, 7 Drawing Figures

METHOD OF MANUFACTURING A SEMICONDUCTOR DEVICE BY PLASMA ETCHING OF A DOUBLE LAYER

The invention relates to a method of manufacturing a semiconductor device, in which a double layer consisting of a layer of polycrystalline silicon and a top layer of a silicide is applied to a surface of a semiconductor substrate coated with a layer of silicon oxide, after which the double layer, after it has been provided with an etching mask, is locally etched away from the layer of silicon oxide in a chlorine-containing etching plasma.

Such a method is more particularly suitable for the manufacture of very large and complicated integrated circuits (especially MOS IC's). In the double layer consisting of a layer of polycrystalline silicon and a top layer of a silicide, conductor tracks can be formed, which combine the advantages of known transitions from silicon oxide to polycrystalline silicon and of a low resistance of silicides.

The article "Anisotropic Etching of $MoSi_2$ and its application to 2 $\mu m$ devices" of K. Nishioka et al in Digest of Papers of the 1982 Symposium on VLSI Technology, Oiso, Japan, Sept. 1–3, 1982, p. 24–5 (New York, U.S.A.: I.E.E.E. 1982) discloses a method of the kind mentioned in the opening paragraph, in which the etching plasma is formed in tetrachloromethane, to which up to about 30% by volume of oxygen is added.

During the process of etching the double layer described, present on a layer of silicon oxide and consisting of a layer of polycrystalline silicon and a top layer of a silicide, a high etching selectivity of polycrystalline silicon with respect to silicon oxide is required; if this selectivity is low, the layer of silicon oxide may in practice be attacked to an unfavorably great extent. This means for the described known method that a comparatively large quantity of oxygen has to be added to the tetrachloromethane. In such a plasma, however, silicides are etched anisotropically, but this is not the case with polycrystalline silicon. This results in underetching of the layer of polycrystalline silicon. The conductor tracks formed will then have cavities located below the top layer at their edges. During further operations, residues of other materials can remain in these cavities and these residues may lead, for example, to shortcircuits.

The invention has for its object to provide a method, which permits etching into the double layer present on the silicon oxide layer conductor tracks having straight profiles with the silicon oxide layer being attacked only to a very small extent in practice.

According to the invention, for this purpose the method mentioned in the opening paragraph is characterized in that the etching plasma is formed in chlorine gas, to which, until the layer of polycrystalline silicon is etched, up to 20% by volume of tetrachloromethane is added. In an etching plasma formed in chlorene gas to which up to 20% by volume of tetrachloromethane is added, silicides and polycrystalline silicon are etched anisotropically. The etching selectivity of polycrystalline silicon with respect to silicon oxide is low, however. By stopping the addition of tetrachloromethane when the layer of polycrystalline silicon is etched, it is achieved that finally the layer of polycrystalline silicon is removed from the silicon oxide by means of a plasma formed in chlorine gas. By means of such a plasma, polycrystalline silicon can also be etched anisotropically, but moreover very selectively with respect to silicon oxide. By the method according to the invention, straight profiles can thus be realized in the double layer, while the layer of silicon oxide will be slightly attacked.

The method according to the invention leads to a method that can be carried out in a simple manner because only the supply of a gas has to be stopped, while moreover the instant at which this should be effected is not very critical. In fact this instant has to lie between the instant at which the layer of polycrystalline silicon is reached and the instant at which it is entirely removed from the layer of silicon oxide. In practice, there is a time interinterval of a few minutes between these instants.

The silicon oxide layer is attacked to an even smaller extent if, after the addition of tetrachoromethane to the chlorine gas has been stopped, up to 10% by volume of hydrogen is added to the chlorine gas. Due to the addition of hydrogen, the etching selectivity of polycrystalline silicon with respect to silicon oxide considerably increases, while the anisotropic etching character remains unchanged.

Preferably, the layer of silicide consists of molybdenum or tungsten silicide because these silicides are etched comparatively rapidly and strongly anisotropically by the method according to the invention; in these cases, no noticeable lateral etching occurs.

Furthermore, the etching plasma is preferably produced by an electromagnetic alternating field having a frequency of 50 to 500 kHz. When the plasma is excited at this comparatively low frequency, it is achieved that no residues are formed during etching.

The invention will now be described more fully, by way of example, with reference to a drawing and a few examples. In the drawing:

FIG. 1 shows diagrammatically in sectional view an apparatus for carrying out a method in accordance with the invention, and FIGS. 2 to 7 show diagrammatically successive stages in the manufacture of a semiconductor device obtained by means of a method in accordance with the invention.

FIG. 1 shows diagrammatically an apparatus for carrying out a method in accordance with the invention comprising a gas-tight housing 1 in which two electrodes 2 and 3 are arranged substantially parallel to each other. A flow of gas indicated by arrows 4 is passed through the housing 1. One electrode 2 is connected to a connection terminal 5, while the other electrode 3 is connected to the housing 1, which in turn is grounded.

When a high-frequency voltage source is connected to connection terminal 5, a high-frequency electromagnetic alternating field is produced between the electrodes 2 and 3, as a result of which a plasma is produced in the flowing gas in the space between the electrodes 2 and 3. A semiconductor substrate 6 present on one electrode 3 can be etched by the plasma thus formed.

FIGS. 2 to 7 show successive stages in the manufacture of a semiconductor device—in this example a MOS transistor—obtained by means of a method in accordance with the invention. A double layer 12 consisting of a layer of polycrystalline silicon 13 and a top layer of a silicide 14 is applied to a surface 11 of a semiconductor substrate 6 coated with a layer of silicon oxide 10. After an etching mask 15 made, for example, of a usual photolacquer has been provided, the double layer 12 is locally etched away from the silicon oxide layer 10 in the apparatus shown in FIG. 1. This is effected in a chlorine-containing plasma.

Thus, conductor tracks can be formed, which combine advantages of known transitions from silicon oxide 10 to polycrystalline silicon 13 and of a low resistance of silicides 14.

Figure 3:
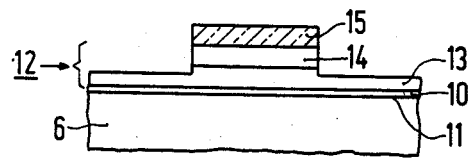
Figure 4:
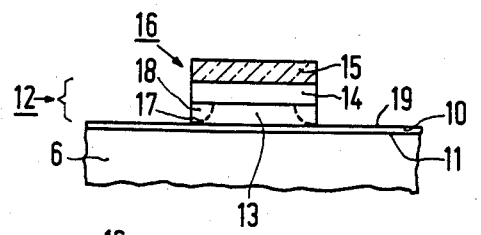

In accordance with the invention, the etching plasma is formed in chlorine gas to which, until the layer of polycrystalline silicon 13 is etched, up to 20% by volume of tetrachloromethane is added. Both silicides and polycrystalline silicon are etched anisotropically in an etching plasma formed in chlorine gas to which up to 20% by volume of tetrachloromethane is added. The etching selectively of polycrystalline silicon with respect to silicon oxide in such a plasma is low, however. If the etching process should be continued with such a plasma until the non-masked parts of the double layer 12 would be entirely removed from the silicon oxide layer 10, the conductor tracks would have straight profiles, but the silicon oxide layer 10 could then be locally attacked to a great extent. The addition of tetrachloromethane is stopped, however, when—as indicated in FIG. 3—a stage is reached at which the etching has advanced into the layer of polycrystalline silicon 13. This layer 13 is thus finally removed from the silicon oxide layer 10 by means of a plasma formed in chlorine gas. By means of such a plasma, polycrystalline silicon is also etched anisotropically, but moreover very selectively with respect to silicon oxide. Thus, the conductor track 16 shown in FIG. 4 is formed in the double layer 12, this conductor track having a very straight profile, while the silicon oxide layer 10 has practically not been attacked.

During the step of forming the conductor track 16, no under-etching of the layer of polycrystalline silicon 13 has occurred. If under-etching had occurred, the conductor track would have a profile indicated by a dotted line 17. Cavities 18 would have formed below the edge of the layer of silicide 14. In such cavities, residues of other materials can remain during further operations, as a result of which, for example, undesired shortcircuits may be formed.

The method according to the invention leads to a process that can be carried out in a simple manner because only the supply of a gas has to be stopped. Moreover, the instant at which this has to take place is not very critical. In fact, this has to be effected after the etching process has advanced so far that the transition between the layers 14 and 13 has been passed, but before the silicon oxide layer 10 has been reached. In practice, there is a time interval of a few minutes between these instants. FIG. 3 indicates diagrammatically the instant at which the supply of tetrachloromethane is stopped.

The silicon oxide layer 10 is attacked to even a smaller extent if, after the addition of tetrachloromethane to the chlorine gas has been stopped, up to 10% by volume of hydrogen is added to the chlorine gas. As a result, the etching selectivity of polycrystalline silicon with respect to silicon oxide increases, while the anisotropic etching character remains unchanged.

The layer of silicide 14 preferably consists of molybdenum silicide or tungsten silicide because these silicides are etched comparatively rapidly and strongly by the method described. No noticeable lateral etching occurs.

Preferably, a voltage is applied to the connection terminal 5 such that the etching plasma is produced by an electromagnetic alternating field present between the electrodes having a frequency of 50 to 500 kHz. The part of the silicon oxide layer 10 exposed by a plasma excited at this comparatively low frequency has a clear surface 19.

Figure 5:
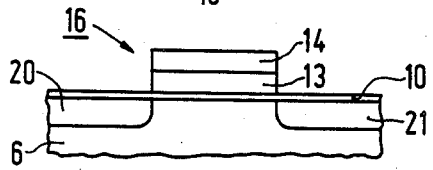
Figure 6:
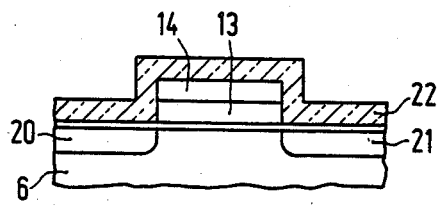
Figure 7:
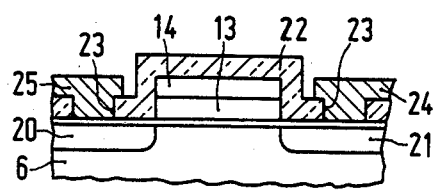

After the etching mask 15 has been removed, in a usual manner semiconductor zones 20 and 21 are formed by means of ion implantation, the conductor track 16 serving as a masking (FIG. 5). Subsequently, the entire structure is coated in a usual manner with an insulating layer 22 (FIG. 6), into which finally contact windows 23 are etched, after which the zones 20 and 21 are contacted in a usual manner with the metal contactings 24 and 25. Thus, a MOS transistor is obtained having a gate electrode constituted by the conductor track 16 obtained by means of the method according to the invention. By the combination of a layer of silicide 14 and a layer of polycrystalline silicon 13, such a gate electrode has the advantages of a gate formed from polycrystalline silicon (the transition between polycrystalline silicon and silicon oxide) and the advantage of a gate electrode formed from a silicide (very low electrical resistance). Due to this favourable combination of properties, such a gate electrode can be very narrow, as a result of which a transistor of the kind shown diagrammatically in FIG. 7 is particularly suitable for the use in large and complicated integrated circuits.

In the embodiments to be described hereinafter, a silicon oxide layer having a thickness of about 50 nm was applied to a silicon substrate having a diameter of about 100 mm by thermal oxidation. A layer of polycrystalline silicon having a thickness of about 200 nm was deposited thereon by means of a usual LPCVD process from dichlorosilane and hydrogen.

A layer of a silicide having a thickness of about 200 nm was deposited on the layer of polycrystalline silicon. After a photolacquer mask consisting of HPR 204 marketed by Hunter Company subjected after an irradiation with shortwave ultraviolet radiation to a heat treatment at about 180° had been provided, the substrate was arranged in an apparatus of the kind shown in FIG. 1 and etched, a current of about 1.5 A from a 380 kHz transmitter being passed through the reactor.

EXAMPLE 1

In this example, the layer of silicide consisted of molybdenum silicide, which was applied in a usual manner by co-sputtering of molybdenum and silicon. At a pressure of about 20 pA, a gas current of 250 scc per minute of $Cl_2$ was passed through the etching reactor, to which initially 15 scc per minute of $CCl_4$ was added. After about 6 minutes the etching had advanced into the layer of polycrystalline silicon. Subsequently, the supply of $CCl_4$ was stopped. About 10 minutes after the beginning of the etching process, the unmasked part of the layer of silicon oxide had been exposed throughout the surface of the silicon substrate. The etching profiles were straight; the layer of silicon oxide was attacked to an extent of less than 10 nm.

EXAMPLE 2

This example differed from Example 1 only with regard to the plasma with which the polycrystalline silicon was etched. In this example, after the addition of $CCl_4$ to the $Cl_2$ had been stopped, about 7 scc per minute of $H_2$ was added to the $Cl_2$. The silicon oxide layer was now attacked to an extent of less than 5 nm.

EXAMPLE 3

In this example, the layer of the silicide consisted of tungsten silicide, which was deposited by means of a usual LPCVD process from tungsten fluoride and silane. At a pressure of 20 Pa, 150 scc per minute of $Cl_2$ was passed through the etching reactor, to which 15 scc per minute of $CCl_4$ was added. After about 2 minutes, the etching had advanced into the layer of polycrystalline silicon and the addition of $CCl_4$ was stopped. About 6 minutes after the beginning of the etching process, the unmasked part of the silicon oxide layer was exposed throughout the surface of the silicon substrate. The etched profiles were straight; the layer of silicon oxide was attacked to an extent of less than 10 nm.

What is claimed is:

1. A method of manufacturing a semiconductor device comprising the steps of
    coating a surface of a semiconductor substrate with a layer of silicon oxide,
    applying a double layer to said layer of silicon oxide, said double layer being a first layer of polycrystalline-silicon contacting said layer of silicon oxide and a second layer of a silicide on top of said first layer,
    forming an etching mask on said double layer, said etching mask having openings to said double layer,
    etching said double layer through said openings with an etching plasma of chlorine gas,
    adding up to 20% by volume of tetrachloromethane to said chlorine gas said adding being sufficient to provide anisotropic etching of both the silicide and the polycrystalline-silicon, and
    stopping supply of said tetrachloromethane to said chlorine gas after said polycrystalline-silicon has been partly etched and before said layer of silicon oxide is etched.

2. A method according to claim 1, wherein up to 10% by volume of hydrogen is added to said chlorine gas etching plasma after said step of stopping supply of said tetrachloromethane.

3. A method according to claim 1 or claim 2, wherein said second layer includes one of molybdenum silicide or tungsten silicide.

4. A method according to claim 3, wherein said etching plasma is produced by an electromagnetic alternating field having a frequency of 50 to 500 kHz.

5. A method according to claim 1 or claim 2, wherein said etching plasma is produced by an electromagnetic alternating field having a frequency of 50 to 500 kHz.

* * * * *